(12) United States Patent
Saito

(10) Patent No.: US 11,664,248 B2
(45) Date of Patent: *May 30, 2023

(54) RESIN SHEET FIXING APPARATUS

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 275 days.

This patent is subject to a terminal disclaimer.

(21) Appl. No.: 17/089,037

(22) Filed: Nov. 4, 2020

(65) Prior Publication Data

US 2021/0134623 A1 May 6, 2021

(30) Foreign Application Priority Data

Nov. 6, 2019 (JP) .............................. JP2019-201386

(51) Int. Cl.
*H01L 21/67* (2006.01)

(52) U.S. Cl.
CPC .............................. *H01L 21/67132* (2013.01)

(58) Field of Classification Search
CPC ......... H01L 21/67132; H01L 21/67103; H01L 21/67109; H01L 21/6835; H01L 2221/68327; H01L 2221/68381; H01L 21/6836

See application file for complete search history.

(56) References Cited

U.S. PATENT DOCUMENTS

| 11,443,951 | B2 * | 9/2022 | Saito | ..................... B05C 11/023 |
| 2002/0187589 | A1 * | 12/2002 | Tsujimoto | ............... H01L 24/83 |
| | | | | 438/106 |
| 2017/0217062 | A1 | 8/2017 | Bae | |
| 2019/0358903 | A1 | 11/2019 | Watanabe et al. | |
| 2020/0023562 | A1 | 1/2020 | Anegawa et al. | |
| 2020/0135531 | A1 * | 4/2020 | Sekiya | ............... H01L 21/6838 |
| 2020/0303230 | A1 | 9/2020 | Sonoda | |

FOREIGN PATENT DOCUMENTS

| JP | 2003077869 A | 3/2003 |
| JP | 2017168565 A | 9/2017 |
| JP | 2019140387 A | 8/2019 |

* cited by examiner

*Primary Examiner* — Michael A Tolin
*Assistant Examiner* — Christopher C Caillouet
(74) *Attorney, Agent, or Firm* — Greer Burns & Crain, Ltd.

(57) ABSTRACT

A sheet holding unit of a resin sheet fixing apparatus includes: a Peltier element that has an upper surface parallel to a sheet holding surface of a sheet holding table and near the sheet holding surface and a lower surface far from the sheet holding surface; a direct current (DC) power source that supplies the Peltier element with a DC; and a switch that switches a direction of the DC supplied to the Peltier element. By causing a current to flow in the Peltier element in a first direction, a resin sheet is softened and welded to a wafer, and by switching the switch to cause a current to flow in the Peltier element in a second direction, the resin sheet held on the sheet holding surface is cured and fixed to a surface on one side of the wafer.

1 Claim, 6 Drawing Sheets

RESIN SHEET FIXING APPARATUS

BACKGROUND OF THE INVENTION

Field of the Invention

The present invention relates to a resin sheet fixing apparatus.

Description of the Related Art

There is a wafer formed with devices in regions partitioned by a plurality of intersecting streets. With this wafer divided along the streets, chips are obtained. In the division, for restraining scattering of the chips attendant on the division, for example, a tape is adhered to a surface on one side of the wafer, as disclosed in Japanese Patent Laid-open No. 2003-077869.

In this technology, after the division, the chips are picked up from the tape. In this instance, a glue of the tape may adhere to the chips. As a countermeasure against this problem, in the technology disclosed in Japanese Patent Laid-open No. 2019-140387, a polyolefin based resin sheet is heated and welded to a surface on one side of the wafer, and thereafter cooling is conducted to solidify the resin sheet. Such a resin sheet serves as a substitute for the tape. In this technology, the chips are picked up from the resin sheet not including a glue, after the division. Therefore, adhesion of a glue to the chips can be avoided.

In this technology, the resin sheet is welded to the surface on one side of the wafer. Therefore, a resin sheet holding unit that holds the resin sheet includes a heater. In addition, for solidifying by cooling the resin sheet welded to the wafer, the sheet holding unit is spaced away from the wafer.

SUMMARY OF THE INVENTION

In the aforementioned technology, a processing apparatus includes a heating table for welding the resin sheet to the wafer, and a cooling table for cooling the resin sheet welded to the wafer. Further, this processing apparatus includes a conveying mechanism for conveying the wafer with the resin sheet welded thereto from the heating table to the cooling table.

Thus, the processing apparatus according to the related art includes the two tables and the conveying mechanism, so that it is difficult to reduce the processing apparatus in size. In addition, time is taken for conveying the wafer. Further, since the resin sheet softened on the heating table is solidified after conveyed to the cooling table, thickness accuracy of the resin sheet is worsened.

It is accordingly an object of the present invention to provide a resin sheet fixing apparatus with which the thickness of a resin sheet welded can be made uniform and which is reduced in size.

In accordance with an aspect of the present invention, there is provided a resin sheet fixing apparatus including a sheet holding unit including a sheet holding table having a sheet holding surface that holds a resin sheet, a wafer holding table that holds a wafer, a vertically moving mechanism that moves the sheet holding unit and the wafer holding table relatively in a vertical direction perpendicular to the sheet holding surface, and a control unit that controls the vertically moving mechanism. The sheet holding unit includes a Peltier element that is disposed inside the sheet holding unit and that has an upper surface parallel to the sheet holding surface and near the sheet holding surface and a lower surface far from the sheet holding surface, a direct current power source that supplies the Peltier element with a direct current, and a switch that switches a direction of the direct current supplied to the Peltier element into a first direction for heating the upper surface of the Peltier element and a second direction, reverse to the first direction, for cooling the upper surface of the Peltier element. The control unit, while pressing the resin sheet held on the sheet holding surface by the wafer held on the wafer holding unit by controlling the vertically moving mechanism, controls the switch to cause the direct current to flow in the first direction to heat the upper surface of the Peltier element, thereby softening the resin sheet and welding the resin sheet to the wafer, and controls the switch to cause the direct current to flow in the second direction to cool the upper surface of the Peltier element, thereby curing the resin sheet held on the sheet holding surface and fixing the resin sheet to a surface on one side of the wafer.

In this resin sheet fixing apparatus, in the state in which the resin sheet is held on the sheet holding surface, the direction of the current flowing through the upper surface of the Peltier element disposed in the vicinity of the sheet holding surface is switched, whereby the resin sheet is fixed to a surface on one side of the wafer. In other words, with the resin sheet kept placed on the sheet holding surface, welding and cooling of the resin sheet are carried out, to thereby fix the resin sheet to the wafer.

Therefore, the number of tables can be reduced as compared to a configuration in which two tables are used for fixing the resin sheet, and the need for means for conveying the resin sheet between the tables can be eliminated. For this reason, the configuration of the resin sheet fixing apparatus can be simplified and reduced in size.

In addition, the resin sheet welded to the wafer on the sheet holding surface is cooled as it is, without being conveyed to another member. Therefore, it is possible to enhance the thickness accuracy of the resin sheet fixed to the wafer, that is, to make uniform the thickness of the resin sheet fixed.

Further, in this resin sheet fixing apparatus, by heating the upper surface of the Peltier element, the sheet holding surface and the resin sheet placed thereon are heated. In this instance, the lower surface of the Peltier element is being cooled, whereby a cooling effect in cooling the sheet holding surface in the subsequent step can be enhanced. Therefore, the time for fixing the resin sheet to the wafer can be shortened.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
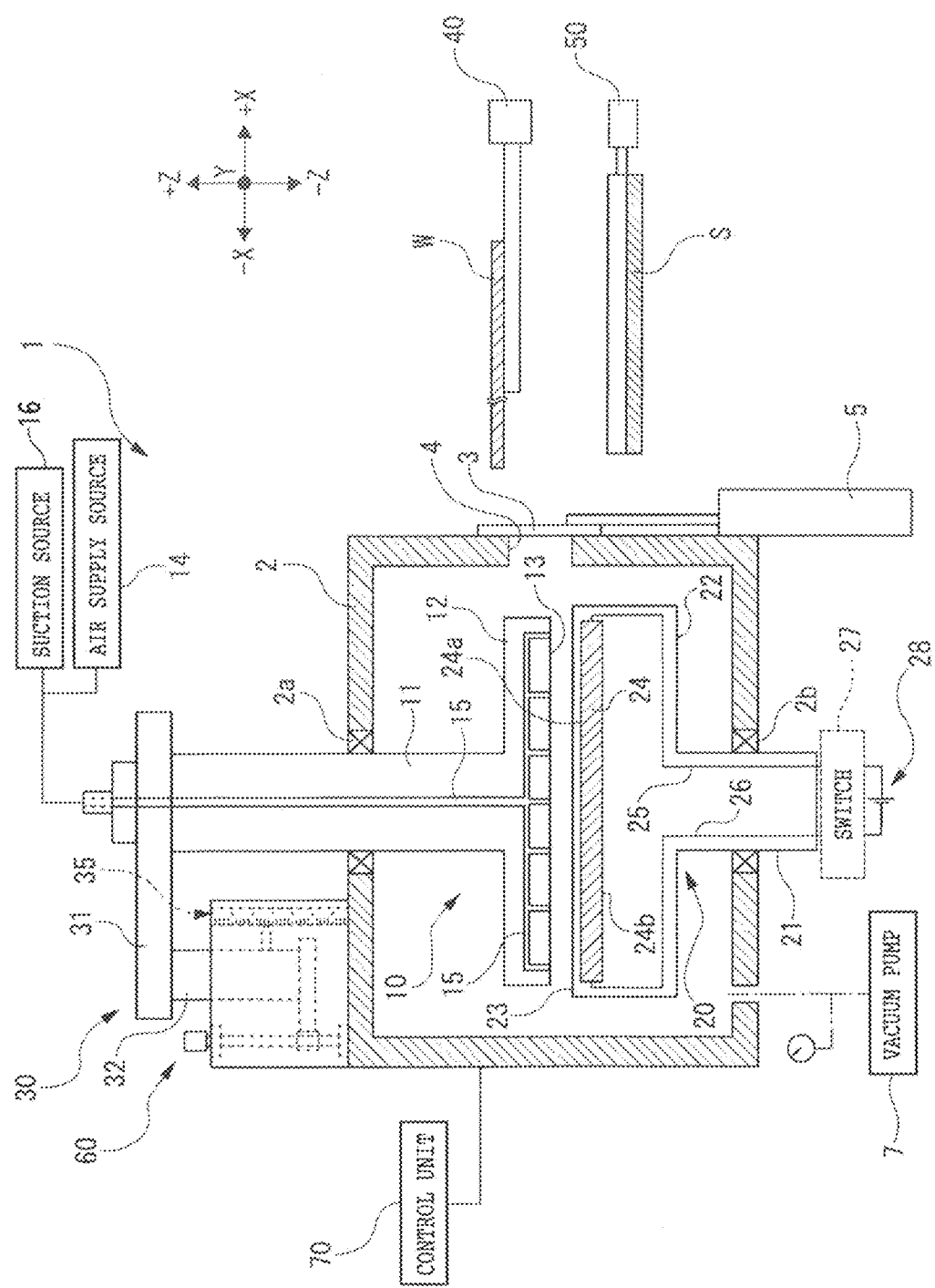
FIG. 1 is a sectional view depicting a configuration of a resin sheet fixing apparatus.

A resin sheet fixing apparatus 1 according to the present embodiment depicted in FIG. 1 is for fixing (forming) a resin sheet S held on a sheet holding surface 23 of a sheet holding unit 20 on a surface on one side of a wafer W. The resin sheet fixing apparatus 1 includes, in a vacuum forming chamber 2, a wafer holding unit 10 that holds the wafer W by a wafer holding surface 13, the sheet holding unit 20 that holds the resin sheet S by the sheet holding surface 23, and a vertically moving mechanism (vertically operating mechanism) 30.

The vacuum forming chamber 2 is a housing of the resin sheet fixing apparatus 1 that is able to establish a vacuum in the inside thereof, and includes an opening 4, a cover 3 capable of covering the opening 4, a cover opening/closing mechanism 5 for opening and closing the cover 3, and a vacuum pump 7 for establishing a vacuum in the inside of the vacuum forming chamber 2. The wafer holding unit 10 includes a support column 11 extending while penetrating an upper surface of the vacuum forming chamber 2, and a wafer holding table 12 that is provided at a lower end of the support column 11 and that is disposed inside the vacuum forming chamber 2. In addition, a lower surface of the wafer holding table 12 is the wafer holding surface 13 that suction holds the wafer W. Note that a vacuum seal 2a for maintaining the vacuum inside the vacuum forming chamber 2 is provided at a part of the upper surface of the vacuum forming chamber 2 which is penetrated by the support column 11.

The support column 11 and the wafer holding table 12 are provided with air passages 15 connected to an air supply source 14 and a suction source 16. The wafer holding surface 13 of the wafer holding table 12 is configured to selectively communicate with the air supply source 14 and the suction source 16 through the air passages 15. The wafer holding unit 10 is capable of suction holding the wafer W by the wafer holding surface 13 communicating with the suction source 16.

The sheet holding unit 20 includes a support column 21 extending while penetrating a bottom surface of the vacuum forming chamber 2, and a sheet support table 22 provided at an upper end of the support column 21 and disposed inside the vacuum forming chamber 2. In addition, an upper surface of the sheet support table 22 is the sheet holding surface 23 on which to place the resin sheet S.

The sheet holding surface 23 is disposed such as to face the wafer holding surface 13 of the wafer holding unit 10. Besides, a vacuum seal 2b for maintaining the vacuum inside the vacuum forming chamber 2 is provided at a part of the bottom surface of the vacuum forming chamber 2 which is penetrated by the support column 21.

In addition, the resin sheet fixing apparatus 1 includes a wafer conveying mechanism 40 and a sheet conveying mechanism 50. The wafer conveying mechanism 40 and the sheet conveying mechanism 50 are conveying members such as robot hands. The wafer conveying mechanism 40 and the sheet conveying mechanism 50 may be separate members, or may be a common single member.

The wafer conveying mechanism 40 conveys the wafer W from outside into the vacuum forming chamber 2. The wafer conveying mechanism 40 is capable of disposing the wafer W at such a position inside the vacuum forming chamber 2 as to face the wafer holding surface 13 of the wafer holding unit 10 through the opening 4. The wafer holding unit 10 is capable of suction holding the wafer W, disposed in this manner, by the wafer holding surface 13 communicating with the suction source 16.

The sheet conveying mechanism 50 conveys the resin sheet S from outside to the resin sheet fixing apparatus 1. The sheet conveying mechanism 50 places the resin sheet S on the sheet holding surface 23 of the sheet holding unit 20 inside the vacuum forming chamber 2 via the opening 4 of the vacuum forming chamber 2.

The vertically moving mechanism 30 is disposed at the upper surface of the vacuum forming chamber 2, and is connected to the support column 11 of the wafer holding unit 10. The vertically moving mechanism 30 moves the wafer holding unit 10 and the sheet holding unit 20 relatively in a Z-axis direction which is the vertical direction perpendicular to the sheet holding surface 23. In the present embodiment, the vertically moving mechanism 30 moves the support column 11 of the wafer holding unit 10 in the Z-axis direction. In other words, the vertically moving mechanism 30 is configured such as to move the wafer holding unit 10 in the Z-axis direction relative to the sheet holding unit 20 which is fixed.

Specifically, the vertically moving mechanism 30 includes: an arm 31 connected to the support column 11 and extending in a horizontal direction; a driving rod 32 connected to the arm 31 and extending along the Z-axis direction; and a sensor 35 that detects a moving distance. With the driving rod 32 moved vertically by a drive source (not illustrated), the arm 31 and the wafer holding unit 10 (support column 11) connected to the arm 31 are moved vertically along the Z-axis direction. The moving distance of the wafer holding unit 10 is detected by the sensor 35.

In addition, the resin sheet fixing apparatus 1 includes a load detector 60. The load detector 60 is connected to the support column 11 of the wafer holding unit 10 through the vertically moving mechanism 30. The load detector 60 detects a load exerted on the wafer holding unit 10 (namely, a force with which the wafer W presses the resin sheet S) when the wafer holding unit 10 and the sheet holding unit 20 make contact with each other through the wafer W and the resin sheet S.

Besides, the sheet holding unit 20 according to the present embodiment has a Peltier element 24 in the inside thereof. The Peltier element 24 has, for example, a flat plate shape, and is disposed in the vicinity of the sheet holding surface 23 of the sheet support table 22 of the sheet holding unit 20, in parallel to the sheet holding surface 23. The Peltier element 24 has an upper surface 24a parallel to the sheet holding surface 23 and near the sheet holding surface 23, and a lower surface 24b far from the sheet holding surface 23.

Further, one-side ends of a first electric power line 25 and a second electric power line 26 drawn around inside the support column 21 and the sheet support table 22 are attached to both ends of the Peltier element 24. The other-side ends of the first electric power line 25 and the second electric power line 26 are connected to a direct current (DC) power source 28 through a switch 27.

The DC power source 28 is a power source that supplies the Peltier element 24 with a DC. The switch 27 has a function of connecting the DC power source 28 to the Peltier element 24 via the first electric power line 25 and the second electric power line 26, and a function of switching a direction of the DC flowing from the DC power source to the Peltier element 24 through the first electric power line 25 and the second electric power line 26.

In other words, the switch 27 is configured such as to switch the direction of the DC supplied to the Peltier element 24 between a first direction for heating the upper surface 24a of the Peltier element 24 and a second direction, reverse to the first direction, for cooling the upper surface 24a of the Peltier element 24. Note that the lower surface 24b of the Peltier element 24 is cooled when the DC flows in the first direction, and the lower surface 24b is heated when the DC flows in the second direction.

In addition, the resin sheet fixing apparatus 1 includes a control unit 70 including a computer that controls the members of the resin sheet fixing apparatus 1. The control unit 70 controls the members of the aforementioned resin sheet fixing apparatus 1 to fix (form) the resin sheet S on a surface on one side of the wafer W.

Figure 2:
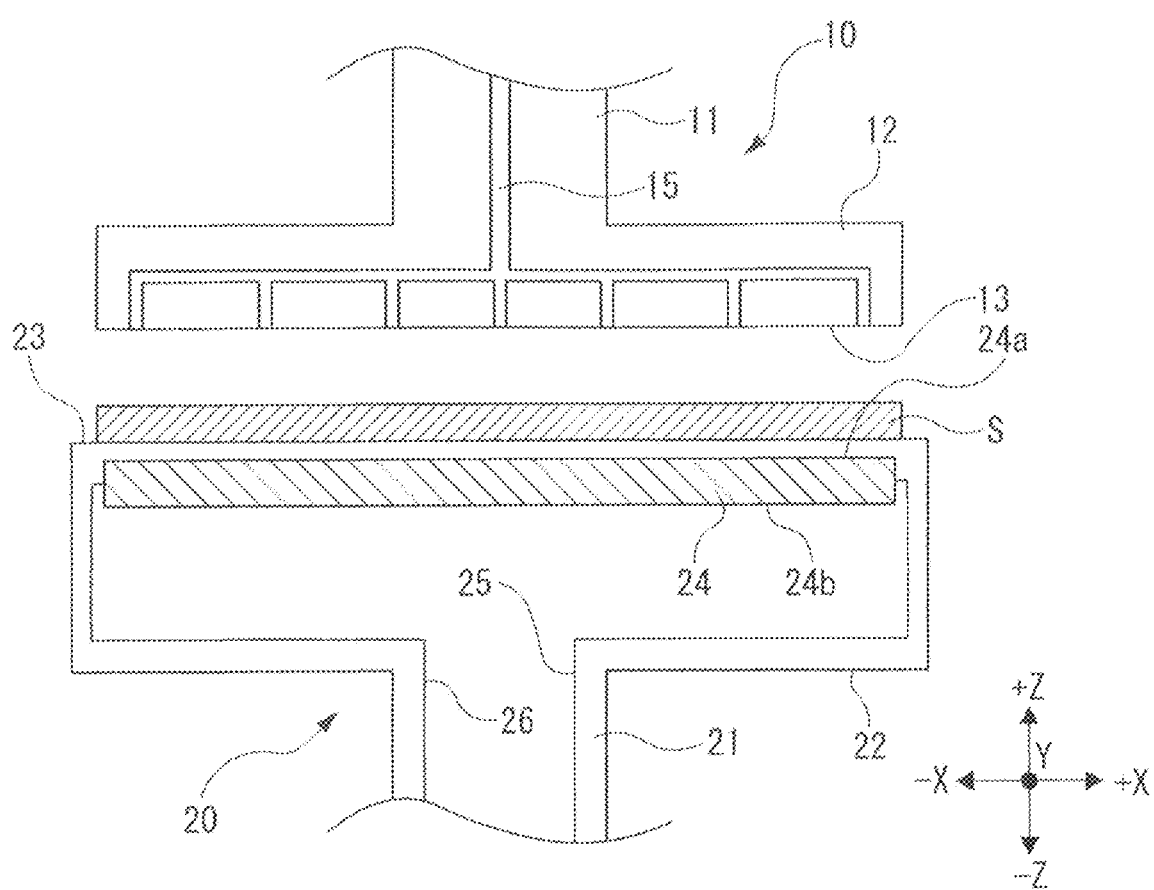
FIG. 2 is a sectional view depicting a resin sheet conveying-in step in the resin sheet fixing apparatus.

Next, a fixing operation of fixing the resin sheet S to the wafer W in the resin sheet fixing apparatus 1 will be described below. First, the control unit 70 controls the cover opening/closing mechanism 5 to open the cover 3 of the vacuum forming chamber 2, thereby exposing the opening 4. Then, the control unit 70 moves the sheet conveying mechanism 50 holding the resin sheet S in a −X direction thereby conveying the resin sheet S into the vacuum forming chamber 2 via the exposed opening 4. Further, the control unit 70 controls the sheet conveying mechanism 50 to place the resin sheet S on the sheet holding surface 23 of the sheet holding unit 20 (resin sheet conveying-in step), as depicted in FIG. 2.

Figure 3:
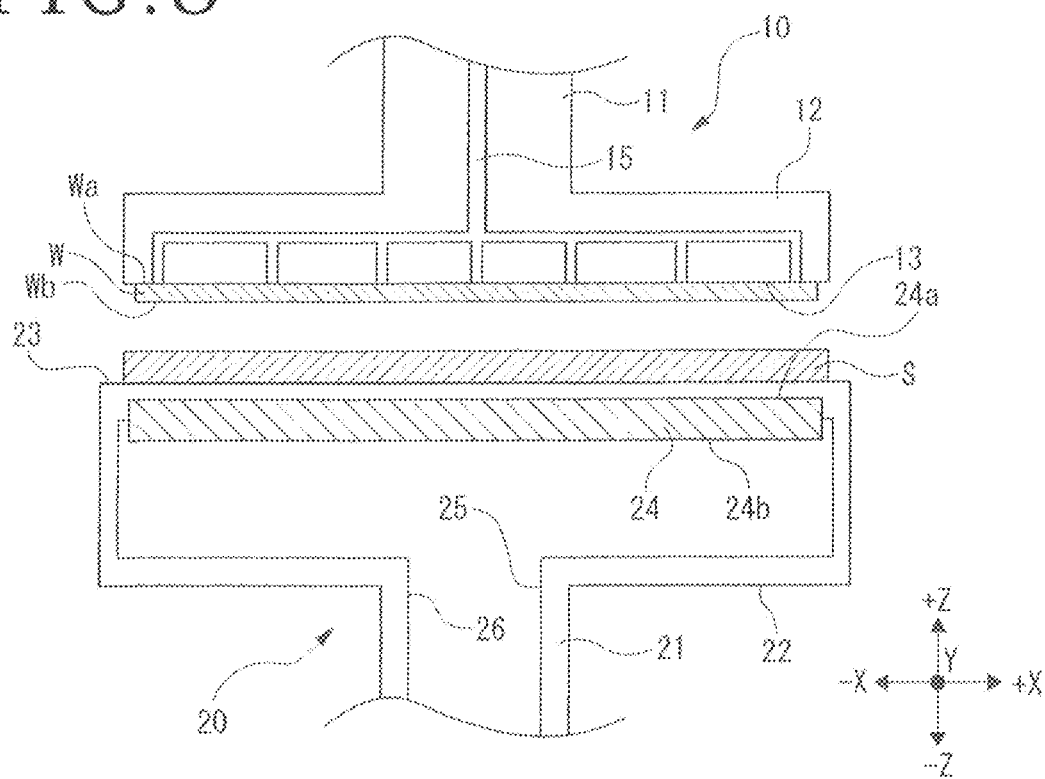
FIG. 3 is a sectional view depicting a wafer holding step in the resin sheet fixing apparatus.

Next, the control unit 70 causes the suction source 16 depicted in FIG. 1 to communicate with the wafer holding surface 13 of the wafer holding unit 10. As a result, a negative pressure is produced at the wafer holding surface 13. Further, the control unit 70 moves the wafer conveying mechanism 40 holding the wafer W in the −X direction, whereby the wafer W is conveyed into the vacuum forming chamber 2 via the exposed opening 4, and is disposed at such a position as to face the wafer holding surface 13. Furthermore, the control unit 70 suction holds a first surface (a surface on the other side) Wa of the wafer W by the wafer holding surface 13, as illustrated in FIG. 3. As a result, in a state in which a second surface (a surface on one side) Wb is made to face the resin sheet S, the wafer W is disposed on an upper side of the resin sheet S held on the sheet holding surface 23 (wafer holding step).

Figure 4:
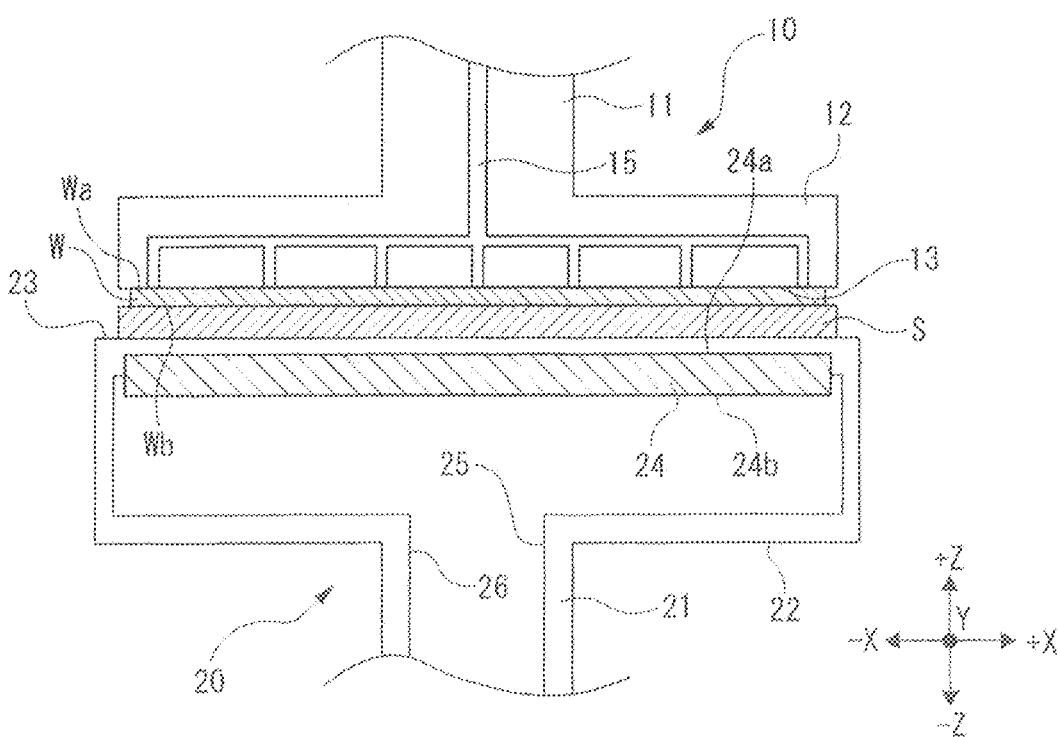
FIG. 4 is a sectional view depicting a wafer pressing step in the resin sheet fixing apparatus.

Subsequently, the control unit 70 controls the cover opening/closing mechanism 5 depicted in FIG. 1 to close the cover 3 of the vacuum forming chamber 2, thereby closing the opening 4. The control unit 70 controls the vertically moving mechanism 30 to move the wafer holding unit 10 downward along the Z-axis direction. As a result, as depicted in FIG. 4, the wafer W held on the wafer holding surface 13 of the wafer holding unit 10 is brought into contact with the resin sheet S held on the sheet holding surface 23 of the sheet holding unit 20 (wafer contact step).

In this way, the control unit 70 controls the vertically moving mechanism 30 to bring the second surface Wb of the wafer W held on the wafer holding unit 10 into contact with the resin sheet S held on the sheet holding surface 23 (to press the resin sheet S with a comparatively weak force). In this state, the control unit 70 controls the vacuum pump 7 to establish a vacuum inside the vacuum forming chamber 2.

Thereafter, when the air pressure inside the vacuum forming chamber 2 becomes equal to or less than a predetermined pressure, the control unit 70 moves the wafer holding unit 10 further downward, to thereby press the resin sheet S with a stronger force by the second surface Wb of the wafer W (wafer pressing step). In this way, the control unit 70 controls the vertically moving mechanism 30 to press the resin sheet S held on the sheet holding surface 23 by the wafer W (second surface Wb) held on the wafer holding unit 10.

Figure 5:
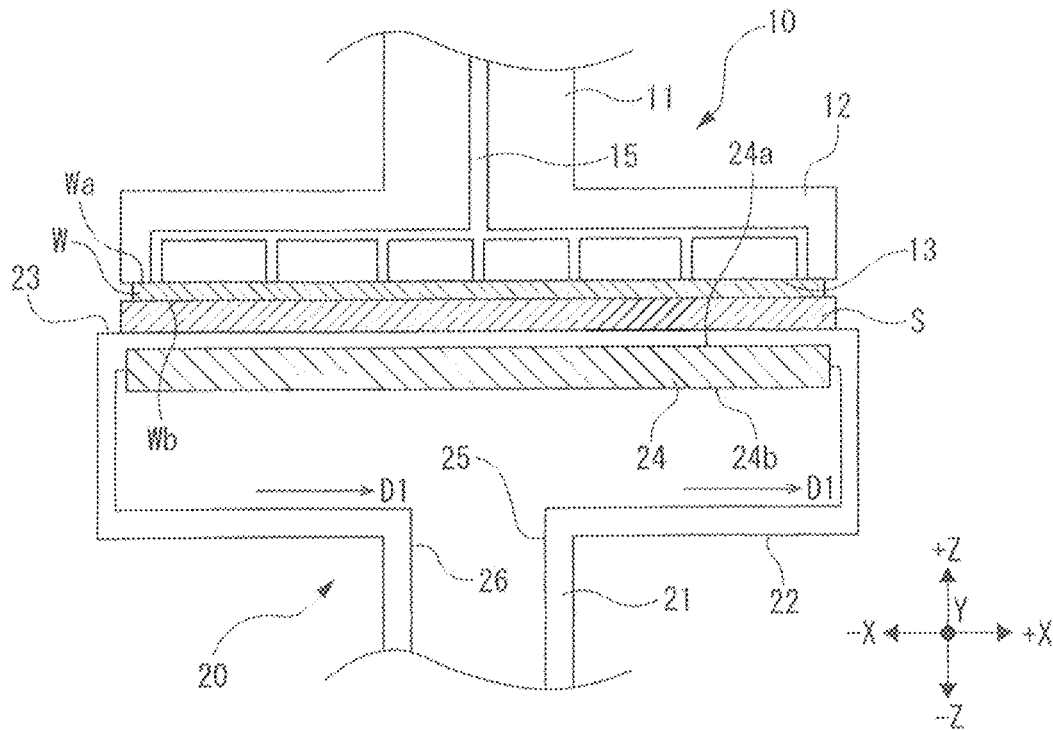
FIG. 5 is a sectional view depicting a heating (welding) step in the resin sheet fixing apparatus.

Further, in this state, the control unit 70 controls the switch 27 depicted in FIG. 1 to connect the DC power source 28 to the Peltier element 24 through the first electric power line 25 and the second electric power line 26. Then, the control unit 70 controls the switch 27 to set the direction of the DC from the DC power source 28 into the first direction for heating the upper surface 24a of the Peltier element 24, as indicated by arrow D1 in FIG. 5.

In this way, the control unit 70, while pressing the resin sheet S by the second surface Wb of the wafer W, causes the DC to flow in the first direction to heat the upper surface 24a of the Peltier element 24, whereby the sheet holding surface 23 and the resin sheet S held on the sheet holding surface 23 are heated, and the resin sheet S is softened and welded to the second surface Wb of the wafer W (heating (welding) step). Note that in this instance, the lower surface 24b of the Peltier element 24 is cooled.

Figure 6:
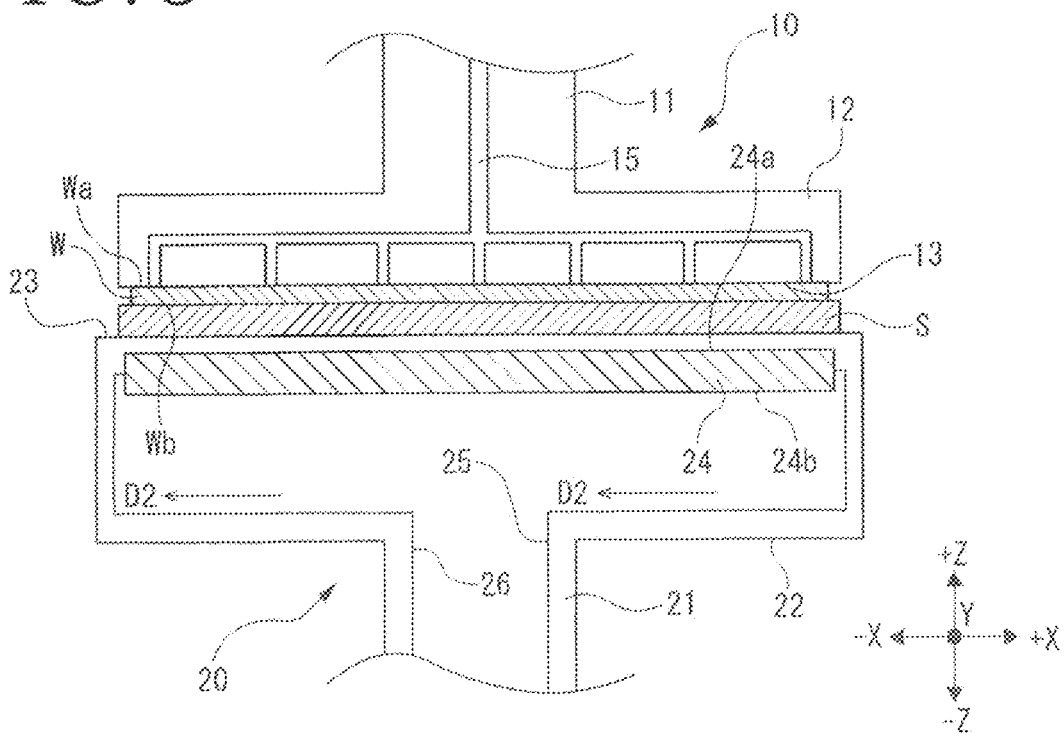
FIG. 6 is a sectional view depicting a cooling (curing) step in the resin sheet fixing apparatus.

After the resin sheet S is welded to the wafer W, the control unit 70 controls the switch 27 (see FIG. 1) to cause the DC from the DC power source 28 to flow in the second direction, reverse to the first direction, indicated by arrow D2 in FIG. 6, for cooling the upper surface 24a of the Peltier element 24. As a result, the control unit 70 cools the upper surface 24a of the Peltier element 24 while pressing the resin sheet S by the second surface Wb of the wafer W. By thus cooling the upper surface 24a, the control unit 70 cools the sheet holding surface 23 and the resin sheet S held on the sheet holding surface 23, whereby the resin sheet S is cured and is fixed to the second surface Wb of the wafer W (cooling (curing) step). Note that in this instance, the lower surface 24b of the Peltier element 24 is heated.

Figure 7:
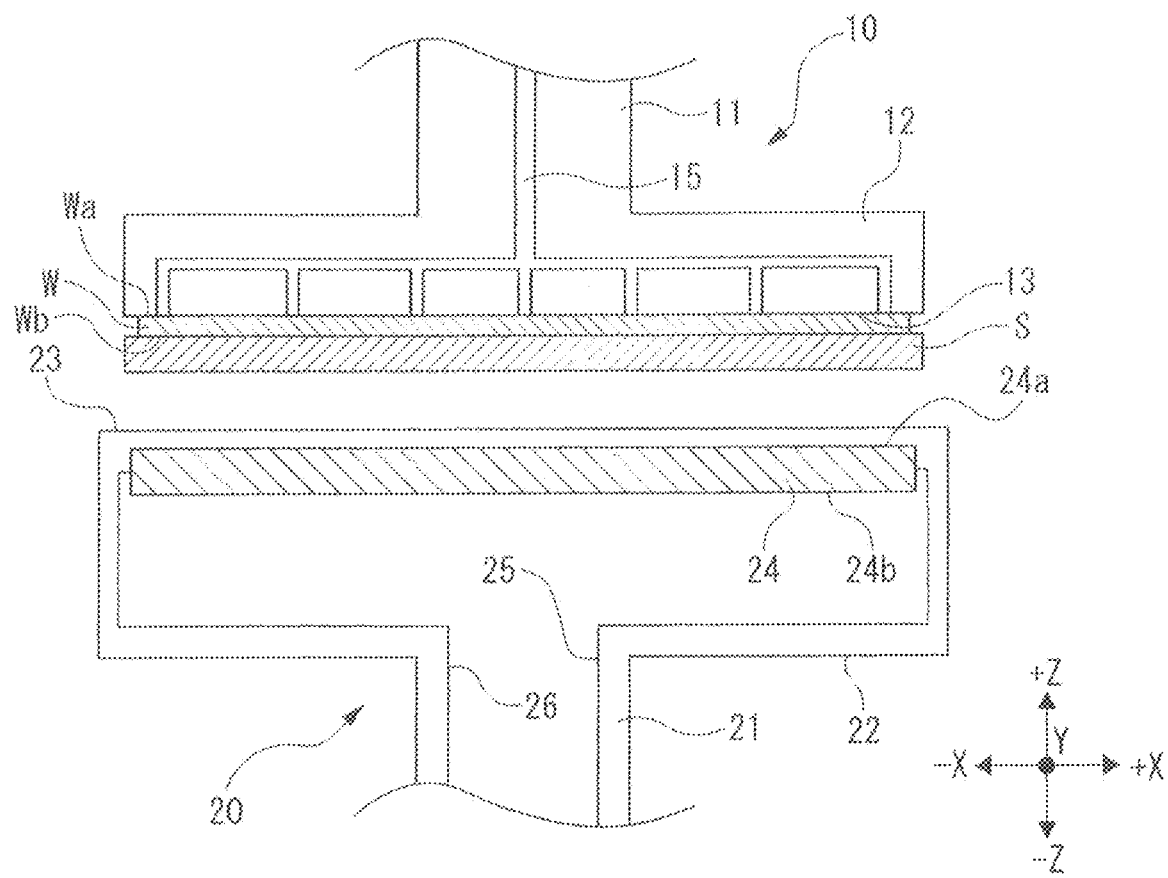
FIG. 7 is a sectional view depicting a spacing-away step in the resin sheet fixing apparatus.

Next, the control unit 70 controls the switch 27 to cut off the DC power source 28 from the Peltier element 24. Then, the control unit 70 controls the vertically moving mechanism 30 depicted in FIG. 1 to move the wafer holding unit 10 upward along the Z-axis direction, thereby spacing the wafer holding unit 10 away from the sheet holding unit 20 (sheet holding surface 23), as illustrated in FIG. 7. In other words, the control unit 70 spaces the resin sheet S, fixed to the second surface Wb of the wafer W, away from the sheet holding surface 23. As a result, the control unit 70 can hold the wafer W, with the resin sheet S fixed to the second surface Wb thereof, on the wafer holding surface 13 of the wafer holding unit 10 (spacing-way step).

Subsequently, the control unit 70 stops the vacuum pump 7 depicted in FIG. 1, and controls the cover opening/closing mechanism 5 to open the cover 3 of the vacuum forming chamber 2, thereby exposing the opening 4. As a result, the vacuum inside the vacuum forming chamber 2 is broken.

Figure 8:
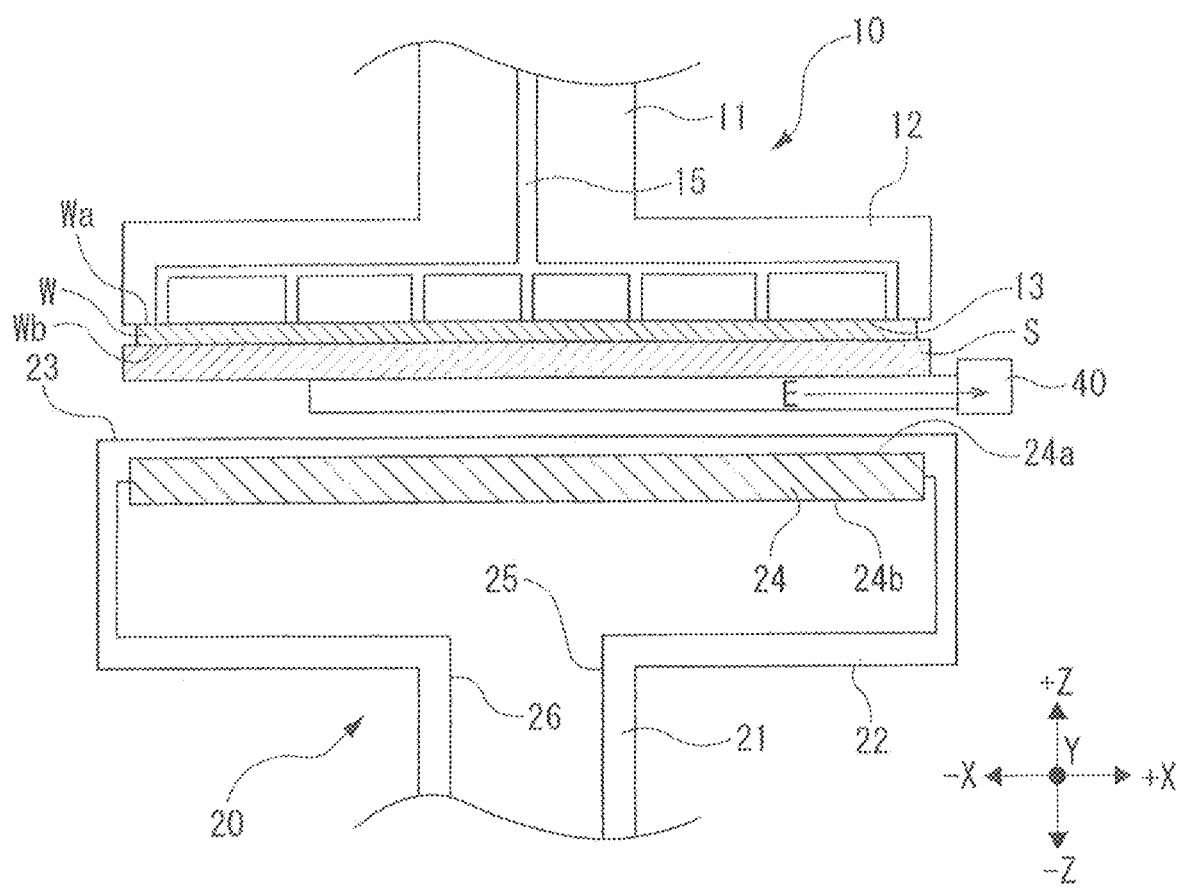
FIG. 8 is a sectional view depicting a wafer conveying-out step in the resin sheet fixing apparatus.

Further, the control unit 70 disposes the wafer conveying mechanism 40 to face the wafer holding surface 13 of the wafer holding unit 10, and brings the wafer conveying mechanism 40 into contact with the resin sheet S covering the second surface Wb of the wafer W, as illustrated in FIG. 8. Furthermore, the control unit 70 causes the wafer holding surface 13 of the wafer holding unit 10 to communicate with the air supply source 14. As a result, the suction of the wafer W by the wafer holding surface 13 is released, and the wafer W is held on the wafer conveying mechanism 40.

Then, the control unit 70 moves the wafer W in a +X direction as indicated by arrow E by the wafer conveying mechanism 40, and conveys the wafer W to the outside of the vacuum forming chamber 2 through the opening 4 (wafer conveying-out step). Note that the wafer conveying mechanism 40 may hold the first surface Wa of the wafer W.

In this way, in the present embodiment, in a state in which the resin sheet S is held on the sheet holding surface 23 of the sheet support table 22, the direction of the current flowing through the upper surface 24a of the Peltier element 24 disposed in the vicinity of the sheet holding surface 23 is switched, to thereby perform the heating (welding) step and the cooling (curing) step. By this, the resin sheet S is fixed to the second surface Wb of the wafer W. In other words, in the present embodiment, with the resin sheet S kept placed on the sheet holding surface 23 of one sheet support table 22, welding and cooling of the resin sheet S are performed, to thereby fix the resin sheet S to the wafer W.

Therefore, the number of tables can be reduced, as compared to the configuration in which two tables are used for fixing the resin sheet S, and the need for means of conveying the resin sheet between the tables can be eliminated. Therefore, it is easy to simplify and reduce the size of the configuration of the resin sheet fixing apparatus 1.

In addition, in a state in which the resin sheet S held on the sheet holding surface 23 is pressed by the second surface Wb of the wafer W held on the wafer holding surface 13, the heating (welding) step and the cooling (curing) step are carried out. In other words, the resin sheet S welded to the wafer W is cooled as it is, without being conveyed to another member. Therefore, it is possible to enhance the thickness accuracy of the resin sheet S fixed to the second surface Wb of the wafer W, namely, to make uniform the thickness of the resin sheet S fixed.

Further, in the present embodiment, in the heating (welding) step, the upper surface 24a of the Peltier element 24 is heated, whereby the sheet holding surface 23 and the resin sheet S placed thereon are heated. In this instance, with the lower surface 24b of the Peltier element 24 being cooled, a cooling effect in cooling the sheet holding surface 23 in the cooling (curing) step which is the subsequent step can be enhanced. Therefore, the time for fixing the resin sheet S to the second surface Wb of the wafer W (the time of the cooling (curing) step) can be shortened.

Note that in the present embodiment, the load exerted on the wafer holding unit 10 when the wafer holding unit 10 and the sheet holding unit 20 make contact with each other through the wafer W and the resin sheet S is detected by the load detector 60 provided at the upper surface of the vacuum forming chamber 2. Such a load detector may be provided inside the wafer holding table 12 of the wafer holding unit 10 or inside the sheet support table 22 of the sheet holding unit 20.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A resin sheet fixing apparatus comprising:
   a sheet holding unit including a sheet holding table having a sheet holding surface that holds a resin sheet;
   a wafer holding table that holds a wafer;
   a vertically moving mechanism that moves the sheet holding unit and the wafer holding table relatively in a vertical direction perpendicular to the sheet holding surface; and
   a control unit that controls the vertically moving mechanism,
   wherein the sheet holding unit includes
      a Peltier element that is disposed inside the sheet holding unit and that has an upper surface parallel to the sheet holding surface and near the sheet holding surface and a lower surface far from the sheet holding surface,
      a direct current power source that supplies the Peltier element with a direct current, and
      a switch that switches a direction of the direct current supplied to the Peltier element into a first direction for heating the upper surface of the Peltier element and a second direction, reverse to the first direction, for cooling the upper surface of the Peltier element,
   wherein the control unit, while pressing the resin sheet held on the sheet holding surface by the wafer held on the wafer holding unit by controlling the vertically moving mechanism, controls the switch to cause the direct current to flow in the first direction to heat the upper surface of the Peltier element, thereby softening the resin sheet and welding the resin sheet to the wafer, and
   controls the switch to cause the direct current to flow in the second direction to cool the upper surface of the Peltier element, thereby curing the resin sheet held on the sheet holding surface and fixing the resin sheet to a surface on one side of the wafer.

\* \* \* \* \*